United States Patent
Varanasi

(10) Patent No.: US 9,524,207 B2
(45) Date of Patent: Dec. 20, 2016

(54) LEE METRIC ERROR CORRECTING CODE

(71) Applicant: Micron Technology, Inc., Boise, ID (US)

(72) Inventor: Chandra C. Varanasi, Broomfield, CO (US)

(73) Assignee: Micron Technology, Inc., Boise, ID (US)

( * ) Notice: Subject to any disclaimer, the term of this patent is extended or adjusted under 35 U.S.C. 154(b) by 149 days.

(21) Appl. No.: 14/475,198

(22) Filed: Sep. 2, 2014

(65) Prior Publication Data

US 2016/0062826 A1    Mar. 3, 2016

(51) Int. Cl.
*H03M 13/00* (2006.01)
*G06F 11/10* (2006.01)
*H03M 13/15* (2006.01)

(52) U.S. Cl.
CPC ...... *G06F 11/1044* (2013.01); *H03M 13/1515* (2013.01); *H03M 13/1535* (2013.01)

(58) Field of Classification Search
CPC .............. G06F 11/1044; G06F 11/1012; G06F 11/1008; G06F 11/1068; G06F 11/1016; H03M 13/1515; H03M 13/1505; H03M 13/19; H03M 13/152; H03M 13/154; H03M 13/1525; H03M 13/6502; H03M 13/3715; H03M 13/1545; H03M 13/296

See application file for complete search history.

(56) References Cited

U.S. PATENT DOCUMENTS

| | | |
|---|---|---|
| 6,272,659 B1 | 8/2001 | Zook |
| 8,176,397 B2 | 5/2012 | Panteleev et al. |
| 8,448,051 B2 | 5/2013 | Toda |
| 8,555,131 B2 | 10/2013 | Rault et al. |
| 8,595,592 B2 | 11/2013 | Toda |
| 8,621,318 B1 | 12/2013 | Micheloni et al. |

(Continued)

FOREIGN PATENT DOCUMENTS

CN    101472184    7/2009

OTHER PUBLICATIONS

Gadiel Seroussi, Teoria de Codigos Algebraicos para Correccion de Errores, Jul. 24, 2005 Information Theory Research group Hewlett-Packard Laboratories, pp. 1-27.*

(Continued)

*Primary Examiner* — Guerrier Merant
(74) *Attorney, Agent, or Firm* — Fletcher Yoder, P.C.

(57) ABSTRACT

A memory device may include memory components for storing data. The memory device may also include a controller that determines whether one or more errors exist in a data packet stored in the memory components. The controller may read a code word associated with the data packet, such that the code word may be used to indicate whether the errors exist in the data packet. The controller may then determine a syndrome polynomial based on the code word and determine an inverse of the syndrome polynomial when the syndrome polynomial is not zero. The controller may then determine a first error locator polynomial and a second error locator polynomial based on the inverse of the syndrome polynomial. The first error locator polynomial and the second error locator polynomial may be used to identify one or more locations of one or more errors in the code word.

27 Claims, 3 Drawing Sheets

(56) References Cited

U.S. PATENT DOCUMENTS

| | | | | |
|---|---|---|---|---|
| 8,898,544 B2* | 11/2014 | Franceschini | ........... | G06F 11/10 714/754 |
| 2002/0016943 A1* | 2/2002 | Hunt | ............... | H03M 13/296 714/755 |
| 2007/0011564 A1 | 1/2007 | Kons et al. | | |
| 2009/0089642 A1* | 4/2009 | Miles | ............... | H03M 13/118 714/752 |
| 2009/0164762 A1* | 6/2009 | Huang | ............ | H03M 13/033 712/223 |
| 2010/0107039 A1* | 4/2010 | Toda | ............... | G06F 11/1068 714/764 |
| 2010/0241932 A1* | 9/2010 | Sakaue | ........... | G06F 11/1016 714/784 |
| 2013/0013974 A1* | 1/2013 | Cideciyan | ........ | G06F 11/1072 714/755 |
| 2013/0024751 A1* | 1/2013 | Yang | ............... | H03M 13/152 714/781 |
| 2013/0132804 A1 | 5/2013 | Frayer et al. | | |
| 2014/0068378 A1* | 3/2014 | Yoshii | ............ | G06F 11/1012 714/764 |

OTHER PUBLICATIONS

Ron M. Roth, Introduction to Coding Theory, 2006, Technion—Israel Institute of Technology, Haifa, Israel pp. 1-559.*

Alexander Zeh, Algebraic Soft- and Hard-Decision Decoding of Generalized Reed-Solomon and Cyclic Codes 2013, pp. 1-160.*

Roth, R.M., Lee-metric BCH codes and their application to constrained and partial-response channels, Jul. 1994, 1083-1096, vol. 40, Issue: 4, Information Theory, IEEE Transactions, http://ieeexplore.ieee.org/xpl/login.jsp?tp=&arnumber=335966&url=http://ieeexplore.ieee.org/xpls/abs_all.jsp?arnumber=335966.

X.-W. Wu, Lee-metric Decoding of BCH and Reed-Solomon Codes, Oct. 16, 2003, 1522-1524, vol. 39, Issue: 21, digital-library.theiet.org/content/journals/10.1049/el_20030912.

* cited by examiner

LEE METRIC ERROR CORRECTING CODE

BACKGROUND OF THE INVENTION

1. Field of the Invention

The present invention relates generally to algorithms used in Error Correcting Code (ECC) applications. In particular, the present disclosure is related to implementing improved encoding and decoding techniques for ECC applications in memory technologies.

2. Description of the Related Art

In certain Error Correcting Code (ECC) applications, a Hamming metric is used to determine whether data stored in a memory device is correct or has been corrupted during a transfer process, storage process, and the like. The Hamming metric generally counts the number of positions in which a stored code word differs from a code word embedded within the data being stored. The Hamming metric does not account for or consider the error values in the identified position; instead, the Hamming metric simply indicates the number of errors that exist with respect to the code word embedded within the data being stored as compared to the code word read back from storage or the memory device. For example, given the alphabet set {0, 1, 2, 3}, if a 5-symbol long stored code word is x=1 2 1 3 2, and if the code word embedded in the data is y=2 2 1 1 2, the Hamming metric indicates that two errors exist between the two code words. That is, code word y differs from code word x in positions 1 and 4, and therefore two errors exist.

When the probability of the amount of error change between any pair of symbols in the code word is approximately the same, the Hamming metric may provide an efficient way to detect errors. However, in situations where there is a higher probability that the error value change between the two code words is relatively small (e.g., change of +/−1), it may be beneficial to incorporate an algorithm or metric into the ECC that accounts for the high likelihood of relatively small error value changes to provide a more efficient ECC. By accounting for the scenario in which small error value changes are more likely to occur as compared to larger error value changes, a more memory-efficient ECC may be used to maintain the integrity of the data being stored.

DETAILED DESCRIPTION OF SPECIFIC EMBODIMENTS

The present disclosure is generally related to using a Lee metric in Error Correcting Code (ECC) applications. More specifically, the present disclosure is related to generating code words by encoding data packets that may be written to memories (e.g., flash memories) and decoding the code words to verify that the data packet has not been corrupted during a previous transfer or storage process. In certain embodiments, the code word may be determined by first generating a normalized primitive Generalized Reed Solomon (GRS) code having a finite field of size q, as specified by a user. The generated code word may include parity bits that may be stored within a data packet as part of the ECC portion of the data packet. The data packet may then be written into a memory location of a memory device or the like.

Upon writing the data packet at a memory location, the memory device may use the code word to verify that the data packet written into the memory location is the same as the data packet read from the memory location. As such, to verify that the data packet read from the memory location is free of errors, the memory device, via the ECC decoder, may first compute a syndrome polynomial of the GRS code word of the data packet. If the syndrome polynomial is zero, the GRS code word is considered to be clean, and thus the data packet has no errors. However, if the syndrome polynomial is not zero, the memory device may determine an inverse of the syndrome polynomial and apply an extended Euclidean algorithm to the inverse syndrome polynomial to determine error locator polynomials $\Lambda(x)$ and $V(x)$. The error locator polynomials $\Lambda(x)$ and $V(x)$ may then be used to determine the error values of the GRS code word. By employing the above process for generating and decoding the code word of a data packet, the memory device may use less memory, and thus may provide a more efficient manner in which to verify the integrity of a stored data packet, as compared to a similar process for encoding and decoding the code word using a Hamming metric.

Figure 1:
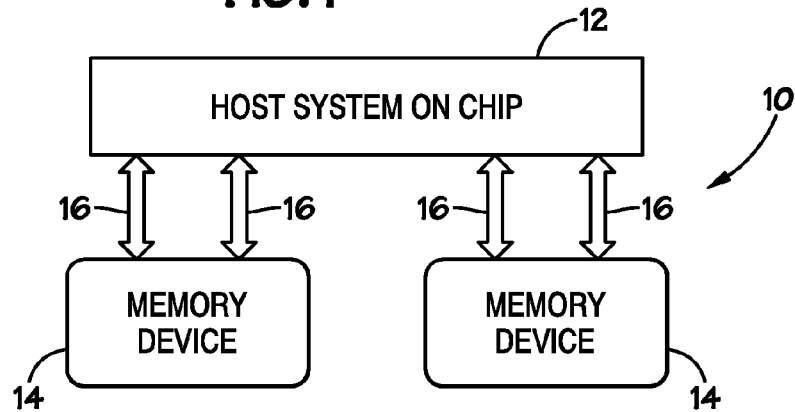
FIG. 1 illustrates a block diagram of an example of a computing system, in accordance with an embodiment.

Keeping the foregoing in mind, FIG. 1 illustrates a block diagram of a computing system 10 that may employ various techniques and systems described herein. The computing system 10 may be any of a variety of computing devices, such as a computer, a pager, a cellular phone, a personal organizer, a control circuit, and the like. The computing system 10 may include a host system on chip (SoC) 12 that may be coupled to a number of memory devices 14. The host SoC 12 may be an integrated circuit (IC) that integrates certain components of a computer or other electronic system into a single chip. As such, the host SoC 12 may include one or more processors, such as a microprocessor, that may control the processing of system functions and requests in the computing system 10.

As mentioned above, the host SoC 12 may be coupled to the memory devices 14. In certain embodiments, the host SoC 12 may be coupled to the memory devices 14 via channels 16. The channels 16 may include buses, electrical wiring, or the like.

Figure 2:
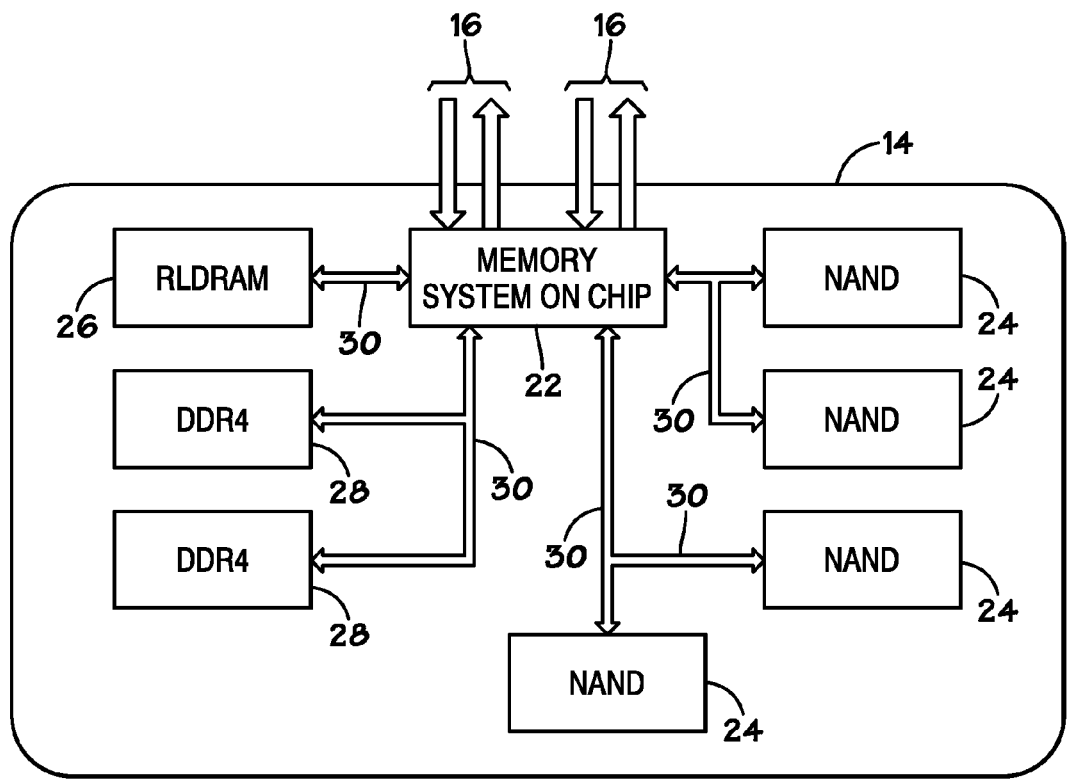
FIG. 2 illustrates a block diagram of an example of a memory device which may be part of the computing system of FIG. 1, in accordance with an embodiment.

FIG. 2 depicts a block diagram of an embodiment of the memory device 14. The memory device 14 may include any electrical storage device designed to retain digital data. The memory device 14 may encompass a wide variety of memory components including volatile memory and non-volatile memory. Volatile memory may include Dynamic Random Access Memory (DRAM) and/or Static Random Access Memory (SRAM). Moreover, the volatile memory may include a number of memory modules, such as single inline memory modules (SIMMs) or dual inline memory modules (DIMMs).

The non-volatile memory may include a read-only memory (ROM), such as an EPROM, and/or flash memory (e.g., NAND) to be used in conjunction with the volatile memory. Additionally, the non-volatile memory may include a high capacity memory such as a tape or disk drive memory. As will be appreciated, the volatile memory or the non-volatile memory may be considered a non-transitory tangible machine-readable medium for storing code (e.g., instructions).

As shown in FIG. 2, in certain embodiments, the memory device 14 may include a system on chip (SoC) 22 that may be a processor-in-memory (PIM) or a computer processor (CPU) tightly coupled to the memory components stored on the memory device 14. Generally, the memory SoC 22 may be on the same silicon chip as the memory components of the memory device 14. By merging the processing and memory components into the memory device 14, the memory SoC 22 may manage the manner in which data requests and responses are transmitted and received between the memory components and the host SoC 12. In certain embodiments, the memory SoC 22 may control the traffic between the memory components to reduce latency and increase bandwidth.

By way of example, the memory device 14 may include memory types such as NAND memories 24, Reduced-latency Dynamic random access memory (RLDRAM) 26, double data rate fourth generation synchronous dynamic random-access memory (DDR4) 28, and the like. Each of these memory types may be communicatively coupled to the memory SoC 22 via channels 30, which may include electrical channels, optical channels, buses, and the like.

Figure 3:
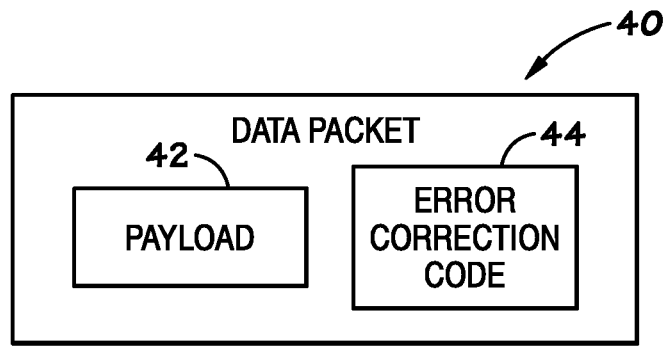
FIG. 3 illustrates a packet level view of a packet that may be transmitted and/or stored within the computing system of FIG. 1, in accordance with an embodiment.

As will be appreciated, the host SoC 12 or the memory SoC 22 may generate a code word, as discussed above, and append parity bits to a data packet in an Error Correcting Code (ECC) portion of the data packet. For example, FIG. 3 illustrates a packet level view of a data packet 40 that may be employed with the systems and techniques described herein. As shown in FIG. 3, the data packet 40 may include a payload field 42 and an error control code (ECC) field 44.

The payload field 42 may include the original data to be written into a memory location. With this in mind, the ECC field 44 may include parity bits added to the payload field 42 based on the generated code word. The parity bits may be used to ensure that the data within the payload field 42 can be recovered without errors. In certain embodiments, the host SoC 12 or the memory SoC 22 may generate the code word that may be used to determine whether the data packet 40 includes any errors after the data packet 40 is read back from the memory.

As discussed above, the Hamming metric is one conventional metric used in the ECC field 44 to determine whether the data packet 40 includes any errors. The Hamming metric generally counts the number of positions in which the code word written into the memory address differs from the one that is read from the memory address. However, the Hamming metric does not consider the error values in those locations. Referring back to the example provided above, given the alphabet set {0, 1, 2, 3}, if a 5-symbol long stored code word is x=1 2 1 3 2, and if the code word embedded in the data is y=2 2 1 1 2, the Hamming metric indicates that two errors exist between the two code words. That is, code word y differs from code word x in positions 1 and 4, and therefore two errors exist.

With this in mind, in certain embodiments, the code word may instead be encoded and decoded using a Lee metric. Unlike the Hamming metric, which merely counts a number errors between the two code words, the Lee metric counts each ±1 change between the two code words as one error. For instance, referring to the stored code word, x=1 2 1 3 2, and the code word embedded in the data, y=2 2 1 1 2, of the example above, the Lee metric determines the difference between the two code words by subtracting set x from set y (i.e., compute y−x). In this case, the difference between the two code words is d=1 0 0 −2 0. When comparing the two code words x and y, the Lee metric identifies a +1 change at position 1 and a −2 change at position 4. As such, the Lee metric indicates that there are 3 errors between code words x and y.

When the probability of change between the two stored code words being +/−1, +/−2, +/−3, etc. is approximately the same for each change, the Hamming metric is a useful tool in verifying whether the data packet includes any errors. However, in situations where the probability of changes between the code words likely to be +/−1, the Lee metric may provide a more efficient means of locating and correcting errors in the data packet by using less resources (e.g., memory) as compared to the Hamming metric. Flash memories, for instance, are memory types in which the amount of change is generally limited in its magnitude based on a value of an immediate neighbor in any respective position of a code word. For example, referring to a multi-level cell (MLC) flash with an alphabet set of {0, 1, 2, 3}, a letter is more likely to be confused with its immediate neighbor in the alphabet than any other letter. As such, employing an ECC that uses the Lee metric for flash memory types may provide a more memory-efficient way to detect errors in data.

Lee Metric

With this in mind, the following discussion provides some details regarding the Lee metric. Generally, a code word for data within the payload field 42 may be determined based on a finite field having a size q. The size q of the finite field may be determined by a user prior to the encoding process. In certain cases, the finite field may be a Galois Field GF (p) of size p, where p is a prime number. In the GF (p) set, the first (p−1)/2 non-zero symbols are referred to as positive symbols and the next (p−1)/2 non-zero symbols are referred to as negative symbols. For example, if p=11 (i.e., {1, 2, 3, 4, 5, 6, 7, 8, 9, 10, 11}, symbols {1, 2, 3, 4, 5} are positive symbols and {6, 7, 8, 9, 10, 11} are negative symbols.

In the Lee metric, a Lee weight of any symbol in GF (p) is determined according to the following features. Firstly, the Lee weight of any symbol in GF (p) does not exceed (p−1)/2. For instance, with GF (11), the Lee weight of values 1, 2, 3, 4, and 5 are 1, 2, 3, 4, and 5, respectively, since each of these values are less than or equal to 5 (i.e., (11−1)/2). The Lee weight of values 6, 7, 8, 9, 10, and 11, however, are 5, 4, 3, 2, 1, and 0, respectively. That is, the Lee weight of any symbol greater than (p−1)/2 is p minus the symbol value. For example, the Lee weight of the symbol value 6 is 11−6 or 5.

The Lee weight of a word equals the sum of the Lee weights of its symbols. For example, the Lee weight of the word w=1 3 4 8 10 2 8 2 of GF (11) is 1+3+4+3 (i.e., 11-3)+1 (i.e., 11-1)+2+3 (i.e., 11-8)+2=19. With this in mind, the Lee distance between two words is the Lee weight of their difference. As an example, in GF (11), the Lee distance between word A=(1 5 6 7) and word B=(2 9 10 3) is determined by first subtracting word B from word A (i.e., A−B=(−1 −4 −4 4)). Since negative values are not part of the GF (11) set, the negative values are converted to positive values by adding the size of the GF (p) set to each negative value. For instance, referring to the example above, the Lee symbol values of the difference between word A and word B is ((11−1) (11−4) (11−4) 4) or (10 7 7 4). After determining the difference between word A and word B, the Lee weight of each symbol value of the difference between word A and word B is determined. As such, the Lee weight of (10 7 7 4) is (1 (i.e., 11−1), 4 (i.e., 11−7), 4 (i.e., 11−7), 4). The Lee weight of the resulting word is then determined by adding the Lee weights of the resulting symbol values. In this manner, the Lee weight of (A−B) is 1+4+4+4=11. Therefore, Lee distance between word A and word B is 11.

Extension Fields

With the foregoing discussion of the Galois Field (GF) in mind, an extension field for the GF (p) base field may be established as an extension field of the GF (p) base field. The extension field GF ($p^m$) lists all m-tuples formed from the alphabet GF (p). For example, if p=2, and m=3, GF ($2^3$) lists all the 3-tuples from the alphabet {0, 1}.

An extension field element may be represented in a power form, a vector form, or a polynomial form. In any case, extension field elements are generated from an irreducible polynomial of degree m with coefficients from GF (p). An irreducible polynomial has no factors in the base field GF (p). For example, neither 0 nor 1 is a root of the polynomial $x^3+x+1$. Therefore, $x^3+x+1$ is an irreducible polynomial in GF (2).

However, $x^3+x+1$ may have roots in the extension field just as a quadratic equation with coefficients from the real field may not have real roots, but can have roots from the complex field. For instance, if "α" is a root of $x^3+x+1$ in the extension field GF ($2^3$), then $\alpha^3+\alpha+1=0$. This equation can be rewritten as $\alpha^3=-\alpha-1$. However, since the finite field does not include negative values, the size of the finite field GF (2) is added to the coefficients of −α and −1 to determine the equivalent equation according to the Lee metric. Applying this logic, the equation becomes $\alpha^3=\alpha+1$ since the coefficients of −α and −1 are both −1 and since 2+−1=1. By repeatedly using this relationship and the fact that $\alpha^i=\alpha^{i-1}*\alpha$, the eight field elements in GF ($2^3$) may be defined in a power form, polynomial form and vector form according to the following table.

TABLE 1

Field Elements of Extension Field GF ($2^3$) formed by irreducible polynomial $x^3 + x + 1$

| Power Form of the Extension Field Element | Polynomial Form of the Extension Field Element | Vector Form of the Extension Field Element |
|---|---|---|
| $\alpha^{-inf}$ | 0 | 0 0 0 |
| $\alpha^0$ | 1 | 1 0 0 |
| $\alpha^1$ | α | 0 1 0 |
| $\alpha^2$ | $\alpha^2$ | 0 0 1 |
| $\alpha^3$ | 1 + α | 1 1 0 |
| $\alpha^4$ | α + $\alpha^2$ | 0 1 1 |
| $\alpha^5$ | 1 + α + $\alpha^2$ | 1 1 1 |
| $\alpha^6$ | 1 + $\alpha^2$ | 1 0 1 |

Generally, regarding the polynomial $x^3+x+1$, an irreducible polynomial is primitive if the powers of its root in the extension field generate all of the members of the extension field. Since the root "α" of $x^3+x+1$ generated all the eight field elements in GF ($2^3$), it is a primitive polynomial. Generally, in GF ($p^m$), there are $p^m-1$ non-zero field elements. As such, in GF ($2^3$), there are 7 non-zero field elements. Base field members of GF (p) are members of the extension field also. For instance, in Table 1, GF (2) members 0 and 1 are $\alpha^{-inf}$ and $\alpha^0$, respectively, in GF ($2^3$).

Generating a Code Word with Lee Metric

Figure 4:
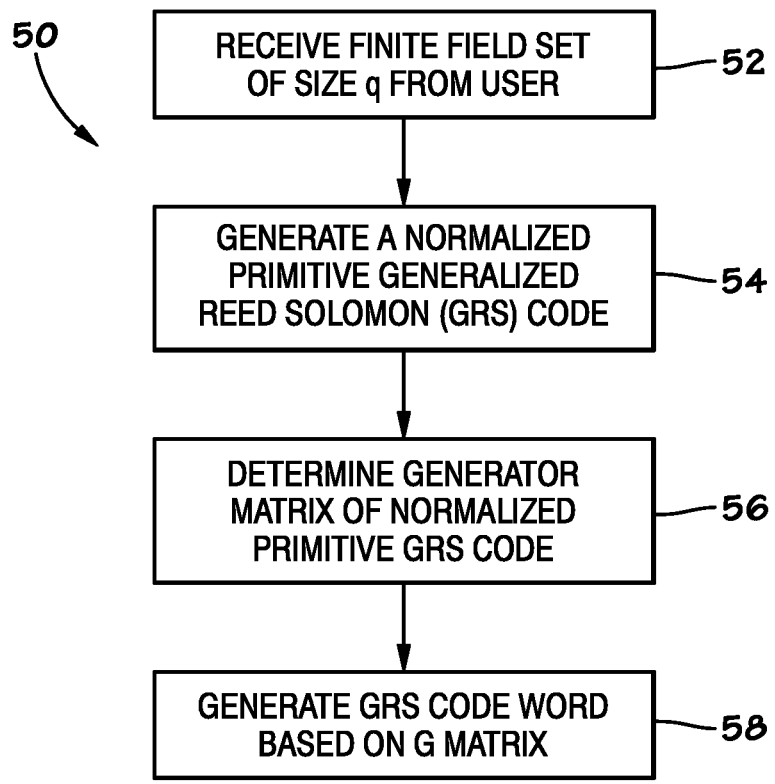
FIG. 4 illustrates a flow chart of a method for generating a code word for use in an Error Correcting Code (ECC) portion of the packet of FIG. 3, in accordance with an embodiment.

Keeping the discussion regarding the Lee metric and the extension fields in mind, FIG. 4 illustrates a method 50 for encoding or generating a code word using the Lee metric. The code word, as mentioned above, may be used by the host SoC 12 or the memory SoC 22 to determine whether any errors exist in the data packet 40 that has been written to a memory address. For discussion purposes, the method 50 is described as being performed by the memory SoC 22. However, it should be understood that the methods and techniques described in the method 50 and in various other methods described herein may be performed by any processor or controller device.

In certain embodiments, the code word may be generated based on k user symbols of the data in the payload field 42 of the data packet 40. The generated code word may include n coded symbols that include the k user symbols. As such, n is greater than k and the additional (n−k) symbols generated are appended to the k user symbols as part of the ECC field 44 to create the code word. The (n−k) symbols of the ECC field 44 are generally referred to as parity symbols. In this manner, the code word is defined by an (n−k)×n parity check matrix H. Tied to parity check matrix H is a generator matrix G. The generator matrix G is used to multiply the k-symbol long user symbol vector to generate the n-symbol long code word. The relationship between the G matrix and the parity check H matrix is defined as G*H', which should equal the all-zero matrix of size k×(n−k).

Keeping this in mind, and referring to FIG. 4, at block 52, the memory SoC 22 may receive a finite field size value q from a user. Generally, the finite field size value q may be determined based on a desired code rate (k/n) associated with the number of correctable errors in the code word. As such, the finite field size value q may be defined or specified to the memory SoC 22 when designing the memory SoC 22 or when determining the ECC to employ to detect data corruption for the data packets in the computing system 10.

At block 54, the memory SoC 22 may generate a normalized primitive Generalized Reed Solomon (GRS) code based on the data within the payload field 42 and the finite field size value q. In one embodiment, the GRS code may be defined by the following (n−k)×n parity check H matrix.

$$H = \begin{pmatrix} 1 & 1 & \ldots & 1 \\ \alpha_1 & \alpha_2 & \ldots & \alpha_n \\ \alpha_1^2 & \alpha_1^2 & \ldots & \alpha_1^2 \\ & & \vdots & \\ \alpha_1^{n-k-1} & \alpha_2^{n-k-1} & \ldots & \alpha_n^{n-k-1} \end{pmatrix} (\text{diag}(v_1 v_2 \ldots v_n)) \quad (1)$$

Here, $\alpha_1, \alpha_2 \ldots \alpha_n$ are non-zero field elements and diag ($v_1, v_2 \ldots v_n$) is an n×n diagonal matrix with the vector ($v_1, v_2 \ldots v_n$) forming the entries along the main diagonal. The entries $\alpha_1, \alpha_2 \ldots \alpha_n$ are called code locators and the entries ($v_1, v_2 \ldots v_n$) are called column multipliers. The integer (n−k) determines the correction capability of the code and is denoted as δ.

A GRS code in GF (q) is primitive if its code word length n is q−1. In this case, code locators are all the non-zero field elements since GF (q) has (q−1) non-zero field elements. A GRS code is then considered to be normalized if each of the column multipliers in the parity check matrix H is 1. For instance, if q=7, then n=(7−1) or 6. If δ=3, then one possible parity check matrix $H_{GRS}$ for this primitive and normalized GRS code is defined as follows.

$$H = \begin{pmatrix} 1 & 1 & 1 & 1 & 1 & 1 \\ 1 & 2 & 3 & 4 & 5 & 6 \\ 1^2 & 2^2 & 3^2 & 4^2 & 5^2 & 6^2 \end{pmatrix} (\text{diag}(\begin{matrix} 1 & 1 & 1 & 1 & 1 & 1 \end{matrix})) \quad (2)$$

After generating the normalized primitive GRS code, at block 54, the memory SoC 22 may determine the generator G matrix of the normalized primitive GRS code at block 56. In one embodiment, the G matrix of the normalized primitive GRS code may be determined according to the following equation.

$$G = \begin{pmatrix} 1 & 1 & \ldots & 1 \\ \alpha_1 & \alpha_2 & \ldots & \alpha_n \\ \alpha_1^2 & \alpha_1^2 & \ldots & \alpha_1^2 \\ & & \vdots & \\ \alpha_1^{k-1} & \alpha_2^{k-1} & \ldots & \alpha_n^{k-1} \end{pmatrix} (\text{diag}(\begin{matrix} \alpha_1 & \alpha_2 & \ldots & \alpha_n \end{matrix})) \quad (3)$$

At block 58, the memory SoC 22 may generate the GRS code word based on the G matrix. In one embodiment, a k-symbol long user word $(u_0, u_1 \ldots u_{k-1})$ may be interpreted as a degree-(k-1) polynomial $u_1 x + u_2 x^2 + \ldots + u_{k-1} x^{k-1}$. As such, to generate each of the n code word symbols in the finite field GF (q), the memory SoC 22 may evaluate the degree-(k-1) polynomial at each of the n code locators.

In certain embodiments, the memory SoC 22 may generate an alternant code if the finite field GF (q) of a GRS code is generated as an extension field GF ($p^m$) from a base field GF (p) and the user symbols are restricted to the base field GF (p). Since the G matrix is still in the finite field GF ($p^m$), the memory SoC 22 may generate parity symbols in the extension field GF ($p^m$). However, since every field element in the extension field GF ($p^m$) is an m-tuple from the base field GF (p), the code rate of the alternant code derived from the GRS code will be (n−δ*m)/n and the underlying GRS code is (n−δ)/n. The percentage code rate penalty of the alternant code relative to the underlying GRS code is 100*δ*(m−1)/n.

In another embodiment, the memory SoC 22 may expand each member of the parity check matrix $H_{GRS}$ as an m-symbol column vector to obtain a parity check matrix $H_{alternant}$ of size δ*m×n, which may entirely be in the base field GF (p). Keeping this in mind, BCH code is an example of an alternant code generated from the parity matrix H of the underlying GRS code.

Upon generating the GRS code word at block 58, the memory SoC 22 may append the determined parity bits to the ECC field 44 of the data packet 40. As such, the memory SoC 22 may decode the code word of the data packet 40 to verify that a stored data packet 40 (i.e., data packet written to a memory location) includes no errors. Additional details regarding the decoding process will be described below with reference to FIG. 5.

Before discussing the decoding process, it should be noted that the correction capability of a Lee metric code is bounded by the sum of the error values that it can correct. For example, if the correction capability of a Lee metric code is 6, the Lee metric code can correct a maximum of 6 positions if the error value in each of those positions is 1. As such, in this case, the sum of the changes between the two code words should be 6 or less. In another example, the error values in two positions of the code words may add to 6 if the error value in each of those positions is 3.

Moreover, if δ is the number of rows in the parity check matrix H of a normalized GRS code formed in the extension field GF ($p^m$), and if $$\delta \leq \frac{p+1}{2},$$

then any error pattern having a Lee weight that is less than δ can be corrected. In other words, the maximum number of correctable Lee jumps (or +/−1 changes in error values) in a code word is (δ−1).

Decoding a Code Word with Lee Metric

Figure 5:
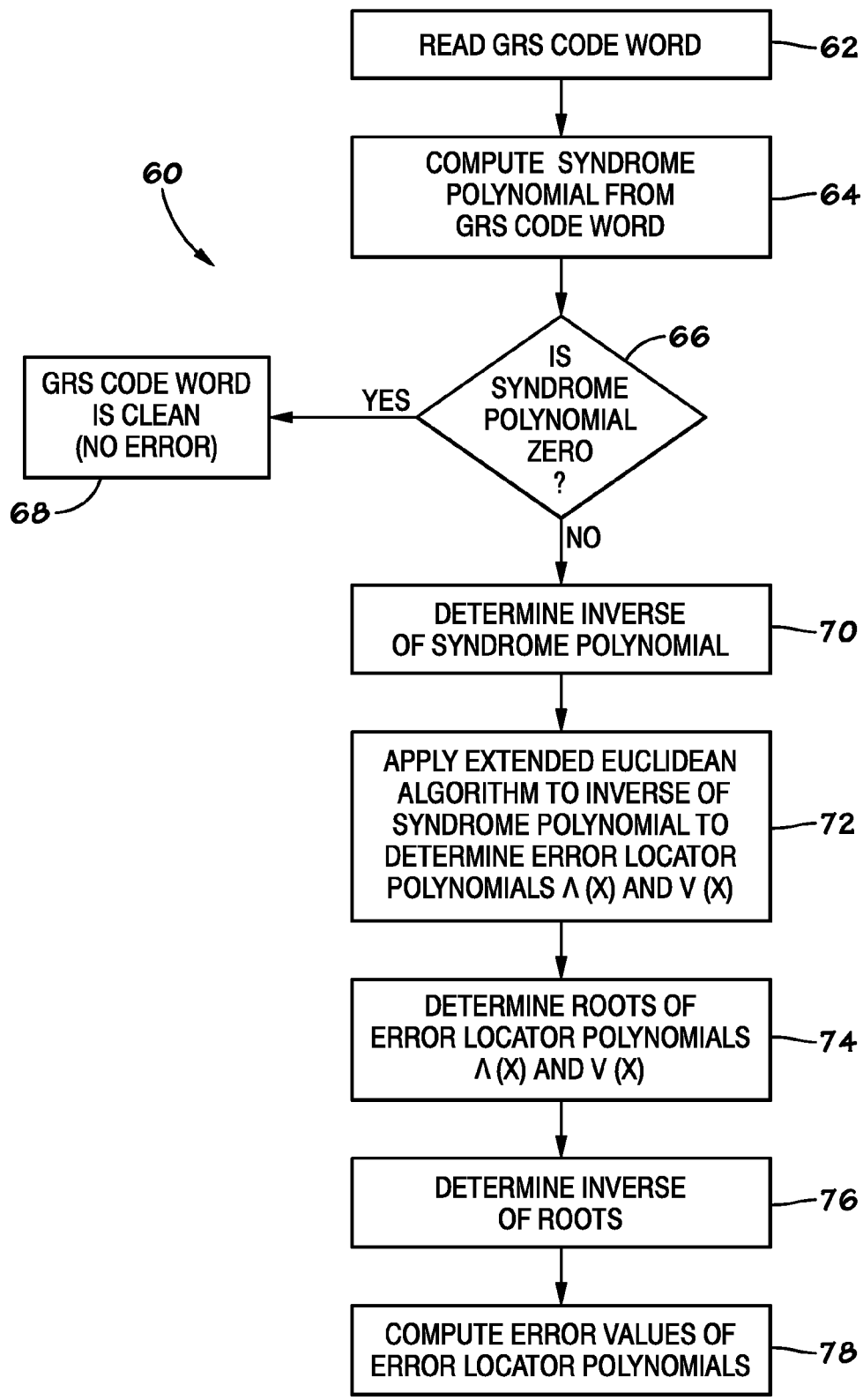
FIG. 5 illustrates a flow chart of a method for decoding the code word generated using the method of FIG. 4, in accordance with an embodiment.

Referring now to FIG. 5, the memory SoC 22 may employ a method 60 for decoding a code word using the Lee metric to verify that the corresponding data of the payload field 42 is free of errors. At block 62, the memory SoC 22 may read the GRS code word associated with the data packet 40, which may be written into a memory address.

At block 64, the memory SoC 22 may compute a syndrome polynomial based on the GRS code word. In certain embodiments, if δ is the number of rows in a parity check matrix $H_{GRS}$, then the syndrome polynomial is computed from the received code word polynomial $y_1 + y_2 x + y_3 x^2 + \ldots + y_n x^n$. For a GRS code, $y_i$ is a field element in the extension field GF ($p^m$) and for alternant code, $y_i$ is a field element in the base field GF (p).

Keeping this in mind, the memory SoC 22 may use the following equation to generate the syndrome values for y(x).

$$S_l = \sum_{j=1}^{n} y_j \alpha_j^l; 0 \leq l \leq \delta \quad (4)$$

In Equation 4, $S_0$ is the sum of the symbols in the received code word. As such, including $S_0$, the memory SoC 22 may generate 6 syndrome values to build the syndrome polynomial as shown in Equation 5 below.

$$S(x) = S_0 + S_1 x + S_2 x^2 + \ldots + S_{\delta-1} x^{\delta-1} \quad (5)$$

At block 66, the memory SoC 22 may determine whether the syndrome polynomial or $S_0$ is 0. If, at block 66, the memory SoC 22 determines that $S_0$ is 0, the memory SoC 22 may proceed to block 68 and determine that there are no errors in the code word. As such, the memory SoC 22 may designate the GRS code word as clean.

If, however, at block 66, the memory SoC 22 determines that the syndrome polynomial or $S_0$ is not 0, the memory SoC 22 may proceed to block 70. At block 70, the memory SoC 22 may determine the inverse of the syndrome polynomial. As such, given a polynomial $a_0 + a_1 x + a_2 x^2 + \ldots$ with coefficients from the field, the polynomial $b_0 + b_1 x + b_2 x^2 + \ldots$ is called its inverse polynomial or its multiplicative inverse if a(x)*b(x) is equal to 1 in the field. The inverse polynomial may thus be generated iteratively according to the following equation.

$$b_0 = \frac{1}{a_0}, \; b_i = -\frac{1}{a_0} a_j b_{i-j}, \; i \geq 1 \quad (6)$$

With this in mind, the inverse (ψ) of the syndrome polynomial may be determined according to Equations 7 and 8 below.

$$\text{Let } \psi(x) = \psi_0 + \psi_1 x + \psi_2 x^2 + \ldots + \psi_{\delta-1} x^{\delta-1} \quad (7)$$

$$\psi_0 = 1; \; \psi_i = -\frac{1}{i} \sum_{l=1}^{i} \psi_{i-l} S_l, \; 1 \leq i \leq \delta \quad (8)$$

After determining the inverse of the syndrome polynomial, at block 72, the memory SoC 22 may apply an extended Euclidean algorithm to determine error locator polynomials Λ(x) and V(x). For reference, the following discussion details the operations of the extended Euclidean algorithm.

Given two integers (a, b), the Euclidean algorithm computes the greatest common denominator (GCD) iteratively. In its update step, the Euclidean algorithm divides the divisor of the previous step with the remainder generated in that step and continues until the remainder is 0. The final divisor—or, the remainder in the penultimate step—is the GCD. For example, given the integers a=133 and b=28, the memory SoC 22 may determine the GCD according to the following process.

$$133=4*28+21;$$

$$28=1*21+7;$$

$$21=3*7+0.$$

Accordingly, the memory SoC 22 determines that the GCD of (133, 28) is 7. In addition to computing the GCD (a, b), the extended Euclidean algorithm also computes two integers—s and t—such that GCD (a, b)=s*a+t*b. The iterative algorithm for determining the integers s and t is provided below.
Initialization Step:

$$r_{-1}=a; r_0=b; s_{-1}=1; s_0=0; t_{-1}=0; t_0=1; i=1;$$

Update Step:
While $r_{i-1} \neq 0$,
$q_i=r_{i-2}/r_{i-1}$ is an update for quotient term and is not retained for next iteration;
$r_i=r_{i-2}-q_i*r_{i-1}$ is an update for the remainder using the Euclidean algorithm;
$s_i=s_{i-2}-q_i*s_{i-1}$ is an update determined using the Extended Euclidean algorithm;
$t_i=t_{i-2}-qi*t_{i-1}$ is an update determined using the Extended Euclidean algorithm; and
i=i+1;
End of while loop An example of applying the extended Euclidean algorithm for the same integer pair (a, b)=(133, 28) is as follows:
Initialization Step
 $r_{-1}=133$, $r_0=28$; $s_{-1}=1$; $s_0=0$; $t_{-1}=0$; $t_0=1$; i=1;
Update Step
 $q_1=133/28=4$; $r_1=133-4*28=21$; $s_1=1-4*0=1$; $t_1=0-4*1=-4$; i=2;
 $q_2=28/21=1$; $r_2=28-1*21=7$; $s_2=0-1*(1)=-1$; $t_2=1-1*(-4)=5$; i=3;
 $q_3=21/7=3$; $r_3=21-3*7=0$; STOP As such, the GCD of (133, 28)=7; s=−1; t=5; and the GCD (133, 28)=−1*133+5*28. By employing the extended Euclidean algorithm as shown above, the memory SoC 22 may determine a multiplicative inverse of a field element in the finite field GF (p), where p is a prime number. Since 'p' is a prime and has no factors, the GCD of p with any field element of GF (p) is 1.

Keeping this in mind, an example for determining the multiplicative of 15 in GF (23) is provided below for reference. Since 23 is a prime number, the GCD of (15, 23)=1. Using the extended Euclidean algorithm, the memory SoC 22 may express the GCD of (15, 23) as 1=s*23+t*15. According to the above equation, in GF (23), any integer multiple of 23 is 0. As such, the memory SoC 22 may set the s integer to 0, and the resulting equation is 1=t*15. In this case, integer t is the multiplicative inverse of 15 in this field. An example of determining the multiplicative inverse of 15 in the finite field GF (23) is provided below for reference.
Initialization Step
 $r_{-1}=23$, $r_0=15$; $t_{-1}=0$; $t_0=1$; i=1;
Update Step
 $q_1=23/15=1$; $r_1=23-1*15=8$; $t_1=0-1*1=-1$; i=2;
 $q_2=15/8=1$; $r_2=15-1*8=7$; $t_2=1-1*(-1)=2$; i=3;
 $q_3=8/7=1$; $r_3=8-1*7=1$; $t_3=-1-1*2=-3$; i=4;
 $q_4=7/1=7$; $r_4=7-7*1=0$; STOP
 GCD (23, 15)=1; t=−3;

Therefore, −3 is the multiplicative inverse of 15. Since −3=23−3=20 in GF (23), 20 is the multiplicative inverse of 15. This may be verified according to mod (15*20, 23)=1, which is written as 15*20≡1 (mod 23) (i.e., 15*20 is congruent to 1 modulo 23).

Keeping the foregoing discussion regarding the extended Euclidean algorithm in mind and referring back to block 72, the memory SoC 22 may apply the extended Euclidean algorithm to the inverse of the syndrome polynomial according to the following procedure. Given two polynomials a(x) and b(x), the extended Euclidean algorithm computes s(x) and t(x) such that $$GCD(a(x),b(x))=s(x)*a(x)+t(x)*b(x) \quad (9)$$

For Lee metric decoding, the following relation holds:

$$\psi(x) \equiv \frac{\Lambda(x)}{V(x)} (\mathrm{mod}\, x^\delta) \quad (10)$$

Another way of expressing the above relationship is:

$$\psi(x) \cdot cV(X) \equiv c\Lambda(x) (\mathrm{mod}\, x^\delta) \quad (11)$$

where c is a constant. With Equation 11 in mind, the memory SoC 22 may use the polynomials $x^\delta$ and ψ(x) as inputs to the extended Euclidean algorithm (i.e., analogous to sending integers a and b as inputs when applying the algorithm to integers as shown above) to obtain the ratio of two polynomials Λ(x) and V(x) as the output. Here, Λ(x) is the error locator polynomial for positive errors (e.g., +1) and V(x) is the error locator polynomial for negative errors (e.g., −1).

With reference to Equation (9), the memory SoC 22 may determine the error locator polynomials using the extended Euclidean algorithm as follows:
Initialize: $a(x)=r_{-1}(x)=x^\delta$ $b(x)=r_0(x)=\psi(x)$
 $t_{-1}(x)=0$; $t_0(x)=1$; i=1;
Update:
 While $r_{i-1}(x) \neq 0$
 $q_i(x)=r_{i-2}(x)/r_{i-1}(x)$ is an update for quotient of division;
 $r_i(x)=r_{i-2}(x)-q_i(x)\, r_{i-1}(x)$ is an update for remainder of division;
The above update step involves the Euclidean algorithm, and the following illustrates an additional step that is employed for applying the extended Euclidean algorithm.
 $t_i(x)=t_{i-2}(x)-q_i(x)\, t_{i-1}(x)$ is an update used to obtain t(x) in Equation 9.
The above updates are repeatedly performed according to the following condition:
 If (degree $(r_i)$−degree $(t_i)$)≤$S_0$−p, STOP; else i=i+1; end
 End While loop After the above algorithm is completed, the memory SoC 22 may identify the integer "i" in the sequence of integers i=0, 1, 2 ... for which (degree $(r_i)$−degree $(t_i)$) is either equal to $S_0$ or $S_0-p$. By denoting the identified integer i as h, the error polynomials may be determined according to:

$$\frac{\Lambda(x)}{V(x)} = \frac{r_h(x)}{t_h(x)} \qquad (12)$$

After the error-locator polynomials are identified, at block 74, the memory SoC 22 may determine the roots of the error locator polynomials $\Lambda(x)$ and $V(x)$. After determining the roots of the error locator polynomials $\Lambda(x)$ and $V(x)$, at block 76, the memory SoC 22 may determine the inverse of the roots. The inverses of the roots identify the locations of the errors in the code word of the data packet 40.

At block 78, the memory SoC 22 may determine the error values of the error locator polynomials. As such, the memory SoC 22 may determine multiplicities of the roots determined at block 74. The multiplicities indicate the error values for the respective errors. As a result, the memory SoC 22 may determine the locations of errors in the data packet 40 along with the values of those errors. In certain embodiments, the memory SoC 22 may determine the error values using Hasse derivatives as described below.

Initially, the memory SoC 22 may determine whether any of the non-zero members of the extension field GF ($p^m$) is a root of $\Lambda(x)$, $V(x)$, or both. If one of the non-zero members of the extension field GF ($p^m$) is a root of $\Lambda(x)$, $V(x)$, or both, the memory SoC 22 may use the Hasse derivative to determine a multiplicity of the respective root. For example, if a polynomial is given by $\sigma(x)=\sigma_0+\sigma_1 x+\sigma_2 x^2+ \ldots +\sigma_l x^l$, then the $p^{th}$ Hasse derivative of $\sigma(x)$ is:

$$\sigma^{[p]}(x) = \sum_{i \geq p} \binom{i}{p} \sigma_i x^{i-p}$$

If the $m^{th}$ Hasse derivative is the first non-zero Hasse derivative of $\sigma(x)$ evaluated at root $\alpha_j$ of the polynomial, then m is the multiplicity of that root in that polynomial. With this in mind, the expanded formats of the first two Hasse derivatives of $\sigma(x)$ is as follows.

The 1st Hasse derivative is: $\sigma^{[1]}(x)=\sigma_1+2\sigma_2 x+3\sigma_3 x^2+ \ldots +l\sigma_l x^{(l-1)}$ The 2nd Hasse derivative is:

$$\sigma^{[2]}(x) = \sigma_2 + \binom{3}{2}\sigma_3 x + \binom{4}{2}\sigma_4 x^2 + \ldots + \binom{l}{2}\sigma_l x^{(l-2)}$$

If an 'h' that determines the error-locator polynomial as described above with reference to block 74 is not determined, or if a root $\alpha_j$ of the polynomial is not determined, the memory SoC 22 may determine that a decoding failure occurred and the original code word may be returned. Alternatively, the memory SoC 22 may use the root $\alpha_j$ of the polynomial to determine the multiplicity m of that root in the polynomial. As mentioned above, the multiplicity m may then be used to determine the error values of the error locator polynomials.

In sum, the decoding process as described with reference to the method 60 is similar to that of decoding BCH codes—or, alternant codes—in the Hamming metric. As shown above, the decoding process makes use of the extended Euclidean algorithm or the Greatest Common Divisor (GCD) algorithm—to locate the positions of Lee errors in the received code word.

Although the decoding process identifies positions of errors like the Hamming metric, employing the Lee metric to determine the error positions includes certain differences from the Hamming metric. Firstly, instead of sending a syndrome of the received code word as an input to the decoding algorithm as provided in the Hamming metric, the memory SoC 22 performing the methods described above send a polynomial, which is a function of the syndrome, to the decoding algorithm. Moreover, in Hamming metric decoding of alternant codes, the GCD algorithm outputs the error-locator polynomial and inverses of the roots of the error-locator polynomial to generate the error locations in the code word. Alternatively, in Lee metric decoding, a ratio of two error-locator polynomials is output to yield locations of positive and negative Lee errors. That is, the inverses of the roots of the numerator polynomial yield locations of the positive Lee errors, and inverses of the roots of the denominator polynomial yield locations of negative Lee errors. Additionally, the error-value computation in error locations in non-binary BCH codes in the Hamming metric does not involve using Hasse derivatives to compute error values, as described above.

Preserving Mapping Between Two Alphabets using the Lee Metric

Since the finite field GF (q) may not include a prime p number of entries, it may be beneficial for the memory SoC 22 to perform a mapping operation to perform the various techniques described herein. For instance, since the alphabet size of a multi-level cell memory (MLC) is 4, the alphabet size of a triple-level cell (TLC) is 8, and the alphabet size of a quad-level cell (QLC) is 16 and these alphabet sizes are not prime numbers, the memory SoC 22 may identify a prime p that is greater than and closest to the corresponding alphabet size to define a base field GF (p). Using this base field GF (p), the memory SoC 22 may perform the encoding and decoding techniques described herein in the corresponding extension field GF ($p^m$) for MLC/TLC/QLC memories, such that m is a positive number of m-tuples formed from the base field GF (p).

Keeping the foregoing in mind, an example of mapping between two alphabets is provided below. If alphabet A has a size A and a larger alphabet B has a size B, and if alphabet A is a subset of alphabet B, then any symbol 'y' in B that is not in A, can be mapped to a string of symbols from the alphabet A: $y \leftrightarrow H (x_1 x_2 \ldots x_h)$. The string length h is the smallest integer such that $x_1+x_2+ \ldots +x_h=y$, where $\{x_i\}$, $1 \leq i \leq h$ are symbols from the alphabet A. In this way, if the memory SoC 22 selects two symbols $y_a$ and $y_b$ from the alphabet B and maps them to A as $y_a=x_1+x_2+ \ldots +x_h$ and $y_b=z_1+z_2+z_h$, respectively, the Lee distance ($y_a-y_b$) in alphabet B is preserved in alphabet A since $(x_1-z_1)+(x_2-z_2)+ \ldots +(x_h-z_h)=(x_1+x_2+ \ldots +x_h)-(z_1+z_2+ \ldots +z_h)=y_a-y_b$. To keep h small, the memory SoC 22 may maintain |B|−|A| as small as possible. Moreover, since the value of h depends only on p—the size of the base field GF (p), h will be greater than or equal to 2. As such, a code may be developed in the alphabet B that can later be mapped to alphabet in A.

Code Rates for Flash Memories

In certain embodiments, the memory SoC 22 may generate Lee metric codes of desired code rates and correction capabilities. That is, the memory SoC may select appropriate values for p, δ, and m to control the code rate and the correction capabilities of the Lee metric code used to encode and decode data packets. For instance, if the code word length n denoted as $n=p^m-1$, the correction capability of the code is denoted as $(\delta-1)$ while the value of $\delta$ is defined as $$\leq \frac{p+1}{2}.$$

Since $$\leq \frac{p+1}{2},$$

p controls the correction power of the code. As such, to obtain a higher correction power, the value of p should increase. Alternatively, to obtain a longer code word length for a given p and $\delta$, the m-tuple value m should increase. As a result, the code rate may also increase. However, it should be noted that increasing the code word length does not increase the correction power of the code. Moreover, the value of h should be minimized since a larger value of h will decrease the code rate. As such, to obtain a higher correction power and code rate, p should increase to a prime value that is closest to the native alphabet size of the flash memory.

Keeping the foregoing in mind, by selecting a prime value p that is larger than the original alphabet size (e.g., sizes of 4, 8, and 16 for MLC, TLC, and QLC, respectively), the memory SoC 22 may generate parity symbols using a larger alphabet, even though user symbols may be restricted to the original alphabet size. By using the mapping technique described above, the memory SoC 22 may map the parity symbols back to the original alphabet's domain. As such, the code rate of an alternant code in an MLC/TLC/QLC symbol domain will be $$R = \frac{n - (h*m*\delta)}{n}.$$

Accordingly, if the channel is an MLC, $3*h \geq (p-1)$. In the same manner, if the channel is a TLC, $7*h \geq (p-1)$. Also, if the channel is a QLC, $15*h \geq (p-1)$.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method, comprising:
receiving a data packet configured to be encoded;
receiving a finite field size associated with encoding the data packet;
generating a normalized primitive Generalized Reed Solomon (GRS) code based on the data packet and the finite field size;
determining a generator matrix based on the normalized primitive GRS code;
generating a code word based on the generator matrix, wherein the code word comprises the data packet and is configured to determine whether the data packet is stored in a memory includes any errors based on a syndrome polynomial of the code word and an inverse of the syndrome polynomial when the syndrome polynomial is not zero, and wherein the inverse of the syndrome polynomial is configured to indicate a first error locator polynomial and a second first error locator polynomial that correspond to one or more locations of one or more errors in the code word; and
storing the data packet having the code word in the memory.

2. The method of claim 1, wherein the code word is generated based on k user symbols that correspond to the data packet.

3. The method of claim 2, wherein the code word comprises n coded symbols, and wherein the n coded symbols is equal to the finite field size minus one for the normalized primitive GRS code.

4. The method of claim 3, wherein the data packet comprises an Error Correcting Code (ECC) field comprising n-k parity bits.

5. The method of claim 3, wherein the code word is defined by a (n-k)×n parity check matrix.

6. The method of claim 3, wherein the code word comprises an n-k correction capability.

7. The method of claim 3, wherein the generator matrix is defined by:

$$G = \begin{pmatrix} 1 & 1 & \ldots & 1 \\ \alpha_1 & \alpha_2 & \ldots & \alpha_n \\ \alpha_1^2 & \alpha_1^2 & \ldots & \alpha_1^2 \\ & & \vdots & \\ \alpha_1^{k-1} & \alpha_2^{k-1} & \ldots & \alpha_n^{k-1} \end{pmatrix} (\text{diag}(\alpha_1 \;\; \alpha_2 \;\; \ldots \;\; \alpha_n))$$

wherein $\alpha$ comprises non-zero field elements that correspond to a finite field having the finite field size.

8. The method of claim 1, wherein the finite field size is a prime number.

9. The method of claim 1, wherein the finite field size corresponds to a Galois finite field.

10. A memory device, comprising;
one or more memory components configured to store data;
a controller configured to determine whether one or more errors exist in a data packet stored in the one or more memory components, wherein the controller is configured to:
read a code word associated with the data packet, wherein the code word is configured to indicate whether the errors exist in the data packet;
determine a syndrome polynomial based on the code word;
determine an inverse of the syndrome polynomial when the syndrome polynomial is not zero; and
determine a first error locator polynomial and a second error locator polynomial based on the inverse of the syndrome polynomial, wherein the first error locator polynomial and the second error locator polynomial are configured to indicate one or more locations of one or more errors in the code word.

11. The memory device of claim 10, wherein the code word is a Generalized Reed Solomon code word.

12. The memory device of claim 10, wherein the code word is a polynomial according to $y_1+y_2x+y_3x^2+ \ldots +y_nx^n$, wherein $y_i$ is a field element in a finite field, and wherein n is a number of symbols that corresponds to the code word.

13. The memory device of claim 12, wherein the syndrome polynomial is determined according to:

$$S_l = \sum_{j=1}^{n} y_j \alpha_j^l; 0 \leq l \leq \delta$$

wherein $\alpha$ is a root of the polynomial, and wherein $\delta$ corresponds to a number of parity bits of the code word.

14. The memory device of claim 13, wherein the syndrome polynomial is defined as $$S(x) = S_0 + S_1 x + S_2 x^2 + \ldots + S_{\delta-1} x^{\delta-1}.$$

15. The memory device of claim 13, wherein the first error locator polynomial and the second error locator polynomial are determined by applying an extended Euclidean algorithm to the inverse of the syndrome polynomial.

16. The memory device of claim 13, wherein the first error locator polynomial is configured to identify one or more positive errors and the second error locator polynomial is configured to identify one or more negative errors.

17. The memory device of claim 12, wherein the locations of the errors in the code word are determined by:
   determining one or more first roots associated with the first error locator polynomial and one or more second roots associated with the second error locator polynomial; and
   determining one or more first inverse roots based on the first roots and one or more second inverse roots based on the first roots and the second roots, respectively.

18. The memory device of claim 10, wherein the memory components comprise flash memories.

19. A tangible, non-transitory, machine-readable medium, comprising instructions to:
   read a code word associated with a data packet stored in a memory component, wherein the code word is configured to indicate whether the errors exist in the data packet;
   determine a syndrome polynomial based on the code word;
   determine an inverse of the syndrome polynomial when the syndrome polynomial is not zero;
   determine a first error locator polynomial and a second error locator polynomial based on the inverse of the syndrome polynomial, wherein the first error locator polynomial and the second error locator polynomial are configured to indicate one or more locations of one or more errors in the code word; and
   determine that the data packet is error free when the syndrome polynomial is zero.

20. The machine-readable medium of claim 19, wherein the code word is a polynomial according to $y_1 + y_2 x + y_3 x^2 + \ldots + y_n x^n$, wherein $y_i$ is a field element in a finite field, and wherein n is a number of symbols that corresponds to the code word.

21. The machine-readable medium of claim 19, wherein the syndrome polynomial is determined according to:

$$S_l = \sum_{j=1}^{n} y_j \alpha_j^l; 0 \leq l \leq \delta$$

wherein $\alpha$ is a root of the polynomial, and wherein $\delta$ corresponds to a number of parity bits of the code word, and wherein the syndrome polynomial is zero when $S_0$ is zero.

22. A controller, configured to:
   read a code word associated with a data packet stored in a memory, wherein the code word is configured to indicate whether the errors exist in the data packet;
   determine a syndrome polynomial based on the code word;
   determine an inverse of the syndrome polynomial when the syndrome polynomial is not zero;
   determine a first error locator polynomial and a second error locator polynomial based on the inverse of the syndrome polynomial, wherein the first error locator polynomial and the second first error locator polynomial are configured to indicate one or more locations of one or more errors in the code word; and
   determine one or more error values of the one or more errors based on the first error locator polynomial and the second error locator polynomial.

23. The controller of claim 22, wherein the inverse of the syndrome polynomial is defined by $$\psi(x) \equiv \frac{\Lambda(x)}{V(x)} (\bmod x^\delta)$$

wherein $\Lambda(x)$ corresponds to the first error locator polynomial, wherein $V(x)$ corresponds to the second error locator polynomial, wherein $\delta$ corresponds to a number of parity bits of the code word, and wherein x corresponds to a polynomial representative of the code word.

24. The controller of claim 22, wherein error values are determined using Hasse derivatives.

25. The controller of claim 24, wherein the error values are determined using the Hasse derivatives by:
   determining whether any non-zero members of an extension finite Galois field is a root of the first error locator polynomial, the second error locator polynomial, or both; and
   determining a multiplicity for each determined root of the first error locator polynomial, the second error locator polynomial, or both based on the Hass derivatives, wherein the multiplicity is configured to determine each of the error values.

26. The controller of claim 24, wherein the Hasse derivatives is determined according to $$\sigma^{[p]}(x) = \sum_{i \geq p} \binom{i}{p} \sigma_i x^{j-p}$$

wherein $\sigma^{[p]}(x)$ is the $p^{th}$ Hasse derivative of a polynomial $\sigma(x)$, wherein $\sigma(x)$ corresponds to the first error locator polynomial or the second error locator polynomial, and wherein p corresponds to a size of the extension finite Galois field.

27. A memory system, comprising:
   one or more memory components;
   a first processor configured to encode a data packet into a code word configured to indicate whether the data packet includes any errors by:
     receiving a finite field size associated with encoding the data packet;
     generating a normalized primitive Generalized Reed Solomon (GRS) code based on the data packet and the finite field size;
     determining a generator matrix based on the normalized primitive GRS code;
     generating the code word based on the generator matrix, wherein the code word comprises the data packet; and
     storing the data packet having the code word in the memory components;
   a second processor configured to decode the code word and determine whether the data packet includes any errors by:

read the code word from the memory components;
determine a syndrome polynomial based on the code word;
determine an inverse of the syndrome polynomial when the syndrome polynomial is not zero; and
determine a first error locator polynomial and a second error locator polynomial based on the inverse of the syndrome polynomial, wherein the first error locator polynomial and the second first error locator polynomial are configured to indicate one or more locations of one or more errors in the code word.

* * * * *